United States Patent
Lew et al.

(10) Patent No.: US 9,818,624 B2
(45) Date of Patent: Nov. 14, 2017

(54) METHODS AND APPARATUS FOR CORRECTING SUBSTRATE DEFORMITY

(71) Applicant: APPLIED MATERIALS, INC., Santa Clara, CA (US)

(72) Inventors: Jen Sern Lew, Singapore (SG); Tuck Foong Koh, Singapore (SG); Sriskantharajah Thirunavukarasu, Singapore (SG); Karthik Elumalai, Bangalore (IN); Eng Sheng Peh, Singapore (SG); Jun-Liang Su, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/142,220

(22) Filed: Apr. 29, 2016

(65) Prior Publication Data

US 2016/0322234 A1     Nov. 3, 2016

(30) Foreign Application Priority Data

Apr. 29, 2015     (IN) ............................ 1190/DEL/2015

(51) Int. Cl.
*H01L 23/48*     (2006.01)
*H01L 23/52*     (2006.01)
(Continued)

(52) U.S. Cl.
CPC ............ *H01L 21/3247* (2013.01); *F27B 9/02* (2013.01); *F27B 9/10* (2013.01);
(Continued)

(58) Field of Classification Search
None
See application file for complete search history.

(56) References Cited

U.S. PATENT DOCUMENTS

| 2003/0080112 | A1 | 5/2003 | Van Bilsen |
| 2014/0103806 | A1* | 4/2014 | Kellogg ............ H01J 37/32449 315/111.21 |
| 2015/0001282 | A1 | 1/2015 | Abe |

FOREIGN PATENT DOCUMENTS

| JP | 2014-150288 A | 8/2014 |
| JP | 2015-035584 A | 2/2015 |
| KR | 10-2013-0076753 A | 7/2013 |

OTHER PUBLICATIONS

International Search Report and Written Opinion dated Jul. 28, 2016 for PCT Application No. PCT/US2016/030079.

* cited by examiner

*Primary Examiner* — Calvin Choi
(74) *Attorney, Agent, or Firm* — Moser Taboada; Alan Taboada (57) ABSTRACT

Embodiments of methods and apparatus for correcting substrate deformity are provided herein. In some embodiments, a substrate flattening system includes: a first process chamber having a first substrate support and a first showerhead, wherein the first substrate support does not include a chucking mechanism; a first heater disposed in the first substrate support to heat a substrate placed on a first support surface of the first substrate support; a second heater configured to heat a process gas flowing through the first showerhead into a first processing volume of the first process chamber; and a second process chamber having a second substrate support, wherein the second substrate support is not heated, and wherein the first process chamber and the cooling chamber are both non-vacuum chambers.

20 Claims, 4 Drawing Sheets

(51) Int. Cl.
    *H01L 29/40*     (2006.01)
    *H01L 21/44*     (2006.01)
    *H01L 21/324*     (2006.01)
    *H01L 21/67*     (2006.01)
    *F27B 9/02*     (2006.01)
    *F27B 9/10*     (2006.01)

(52) U.S. Cl.
    CPC .. *H01L 21/67109* (2013.01); *H01L 21/67248* (2013.01); *H01L 21/67288* (2013.01)

METHODS AND APPARATUS FOR CORRECTING SUBSTRATE DEFORMITY

CROSS-REFERENCE TO RELATED APPLICATIONS

This application claims benefit of India provisional patent application serial number 1190/DEL/2015, filed Apr. 29, 2015, which is herein incorporated by reference.

FIELD

Embodiments of the present disclosure generally relate to correcting deformities in a substrate.

BACKGROUND

Epoxy mold compounds are used to encapsulate dies in substrate packaging. These compounds bow and warp after thermal processes due to inhomogeneous heating and cooling, causing non-uniform expansion/contraction rates in current process equipment. Conventional thermal processes utilize directional heat transfer via radiative, convective or conductive thermal processes. The directionality results in anisotropic expansion and contraction rates. When operated near the thermoplastic regime, non-uniform cooling and, subsequently, contraction rates give rise to a warped substrate. Such warp and bow effects are frequently observed and imply that the substrate is being processed close to the thermoplastic regime of the substrate, giving rise to warpage beyond acceptable levels.

Therefore, the inventors have provided embodiments of methods and apparatus for correcting substrate deformity.

SUMMARY

Embodiments of methods and apparatus for correcting substrate deformity are provided herein. In some embodiments, a substrate flattening system includes: a first process chamber having a first substrate support and a first showerhead, wherein the first substrate support does not include a chucking mechanism; a first heater disposed in the first substrate support to heat a substrate placed on a first support surface of the first substrate support; a second heater configured to heat a process gas flowing through the first showerhead into a first processing volume of the first process chamber; and a second process chamber having a second substrate support, wherein the second substrate support is not heated, and wherein the first process chamber and the cooling chamber are both non-vacuum chambers.

A method for correcting substrate deformity includes: heating a warped substrate to a first predetermined temperature between about 150° C. and about 220° C.; holding the substrate at the first predetermined temperature for a first time period; and cooling the substrate to a second predetermined temperature less than the first predetermined temperature by flowing a coolant through a plurality of heat transfer channels in a substrate support to flatten the substrate.

In some embodiments, a method for correcting substrate deformity includes: placing a warped substrate on a first substrate support in a first process chamber; heating the warped substrate to a first predetermined temperature; holding the warped substrate at the first predetermined temperature for a first time period to deform the warped substrate into a planarized substrate; cooling the planarized substrate to a second predetermined temperature less than the first predetermined temperature; placing the planarized substrate on a second substrate support of a second process chamber; and cooling the planarized substrate to a third predetermined temperature less than the second predetermined temperature.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method and apparatus for correcting substrate deformity are provided herein. The method and apparatus may advantageously planarize a substrate that has bowed or warped due to heating and/or cooling of a substrate during previous processing, in particular substrates having epoxy coatings.

Figure 1:
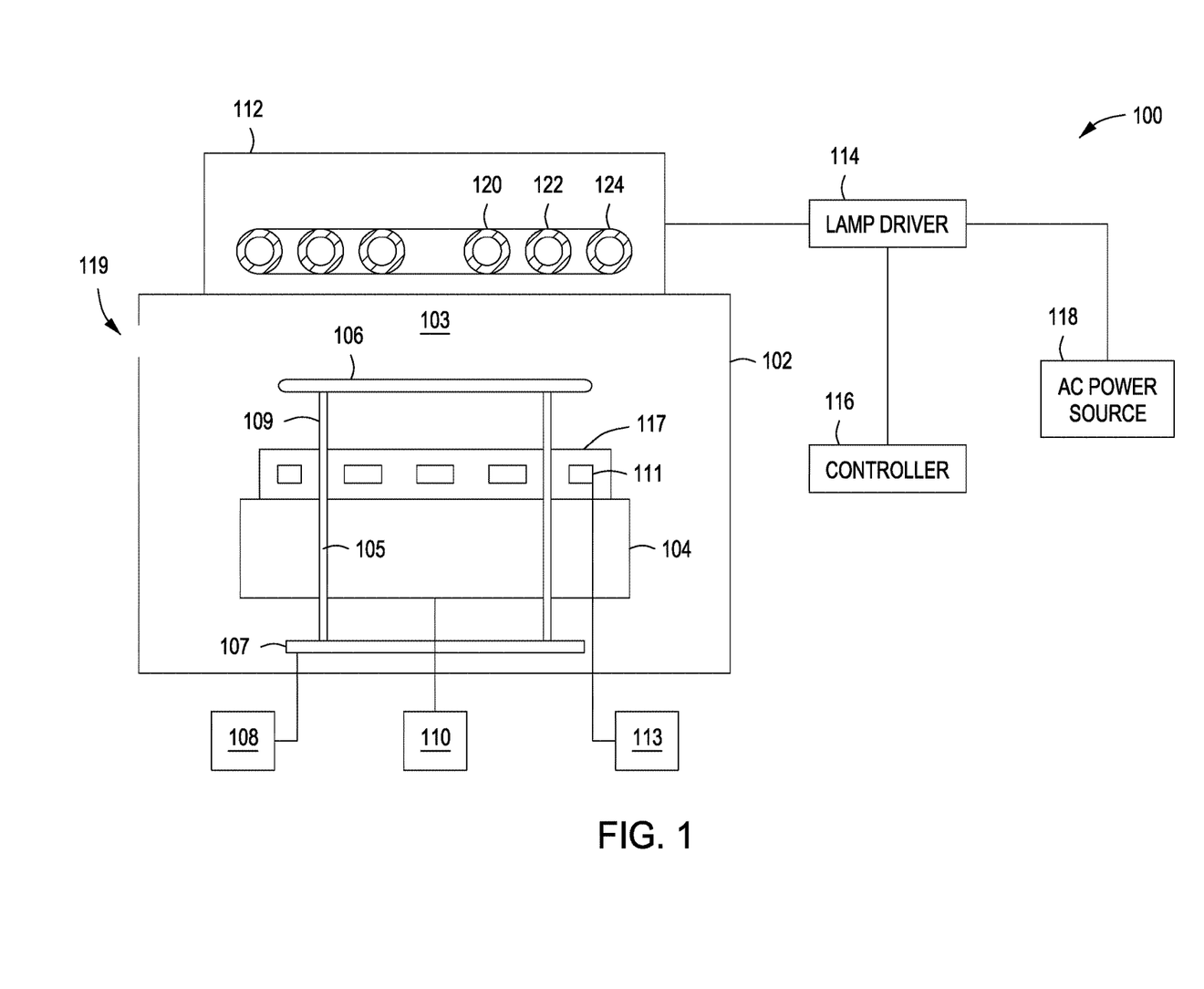
FIG. 1 depicts a block diagram of a substrate processing system in accordance with some embodiments of the present disclosure.

FIG. 1 depicts a block diagram of a substrate processing system 100 suitable for performing the inventive method in accordance with some embodiments of the present disclosure in accordance with embodiments of the present disclosure. As depicted in FIG. 1, the substrate processing system 100 comprises a chamber 102 enclosing a processing volume 103, a support 104 for supporting a substrate 106, a lift pin assembly 107, a vacuum source 110, a heat transfer supply 113, a radiative heat source (lamp array 112), lamp driver 114, controller 116, and an AC power source 118. One or more temperature sensors and associated hardware (not shown) may be provided and coupled to the controller for controlling the temperature within the processing volume 103. The substrate 106 is, for example, a semiconductor wafer. The substrate 106 may comprise an epoxy coating disposed thereon.

The lift pin assembly 107 includes a plurality of lift pins 109 that extend through a corresponding plurality of lift pin channels 105 formed in the support 104. The lift pin assembly 107 may be raised and lowered by a driving mechanism 108 (such as a motor or actuator) to raise and lower the substrate 106 onto or off of a support surface 117 of the support 104. The chamber 102 may further include an opening 119 through which a robotic arm (not shown) extends to insert/remove the substrate 106 onto/from the plurality of lift pins 109. The lift pin assembly 107 is moveable between a first position, in which the substrate is proximate the lamp array 112, and a second position, in which the substrate 106 rests on the support surface 117. In some embodiments, the substrate 106 is heated to first predetermined temperature in the first position and cooled to second predetermined temperature in the second position.

In some embodiments, the support 104 is a vacuum chuck to which the vacuum source 110 is coupled to chuck the substrate 106 onto the support surface 117. In some embodiments, the support 104 may alternatively be an electrostatic chuck. The support 104 includes a plurality of heat transfer channels 111 fluidly coupled to a heat transfer supply 113. In some embodiments, for example, the heat transfer supply 113 may provide a coolant to the heat transfer channels 111 to cool the substrate 106 placed atop the support surface 117 of the support 104.

The AC power source 118 delivers AC power to the lamp driver 114, the operation of which is controlled by the controller 116. The lamp driver 114 distributes power to the lamp array 112. In turn, the lamp array 112 produces heat to thermally treat the substrate 106 within the chamber 102.

In some embodiments, the lamp array 112 comprises one or more lamps, each may be individually controlled by the controller 116 through the lamp driver 114. As illustrated in FIG. 1, three lamps (120, 122, 124) are shown, although a lesser number or a greater number of lamps may be used. Each lamp 120, 122, 124 may be individually controlled by the controller 116 to provide heat to corresponding heating zones. Because the lamps may be individually controlled, the temperature in the heating zones may also be controlled.

Figure 2:
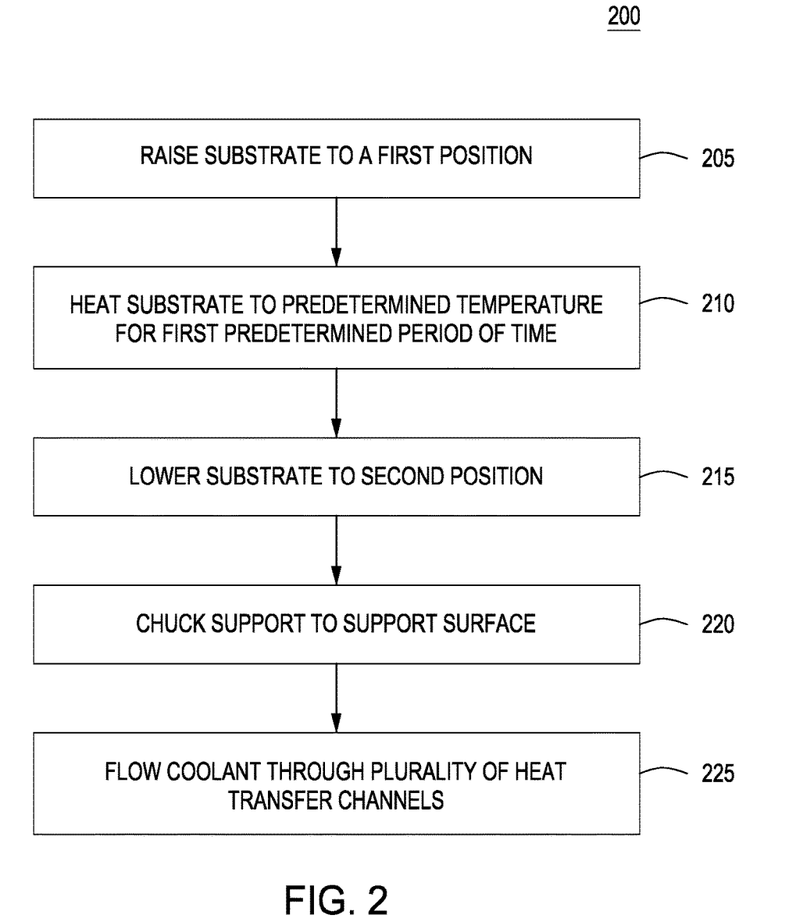
FIG. 2 shows a flow chart illustrating a method for correcting substrate deformity in accordance with some embodiments of the present disclosure.

FIG. 2 is a flowchart illustrating a method 200 for correcting substrate deformity in accordance with some embodiments of the present disclosure. At 205, the substrate 106 that is deformed (i.e., warped, bowed, etc.) is raised to a first position proximate the lamp array 112 by the lift pin assembly 107. At 210, the substrate 106 is heated to a predetermined temperature for a first predetermined period of time. The predetermined temperature may be at or above a glass transition temperature of an epoxy disposed on the substrate (for substrates having an epoxy coating). For example, the substrate 106 may be heated to a temperature of about 180° C. to about 220° C. for a duration of about 30 seconds to 60 seconds. At 215, the substrate 106 is lowered to a second position onto the support surface 117. At 220, the substrate 106 is chucked to the support surface 117 to planarize the deformed substrate. At 225, a coolant is flowed through the heat transfer channels 111 for a second predetermined period of time to cool the substrate 106 and retain the planarized shape of the substrate 106. The substrate 106 is cooled to a temperature at least below the glass transition temperature for an epoxy coating on the substrate, such as at or below about 130° C. In some embodiments, the second predetermined period of time is between about 30 seconds to about 60 seconds.

Figure 3:
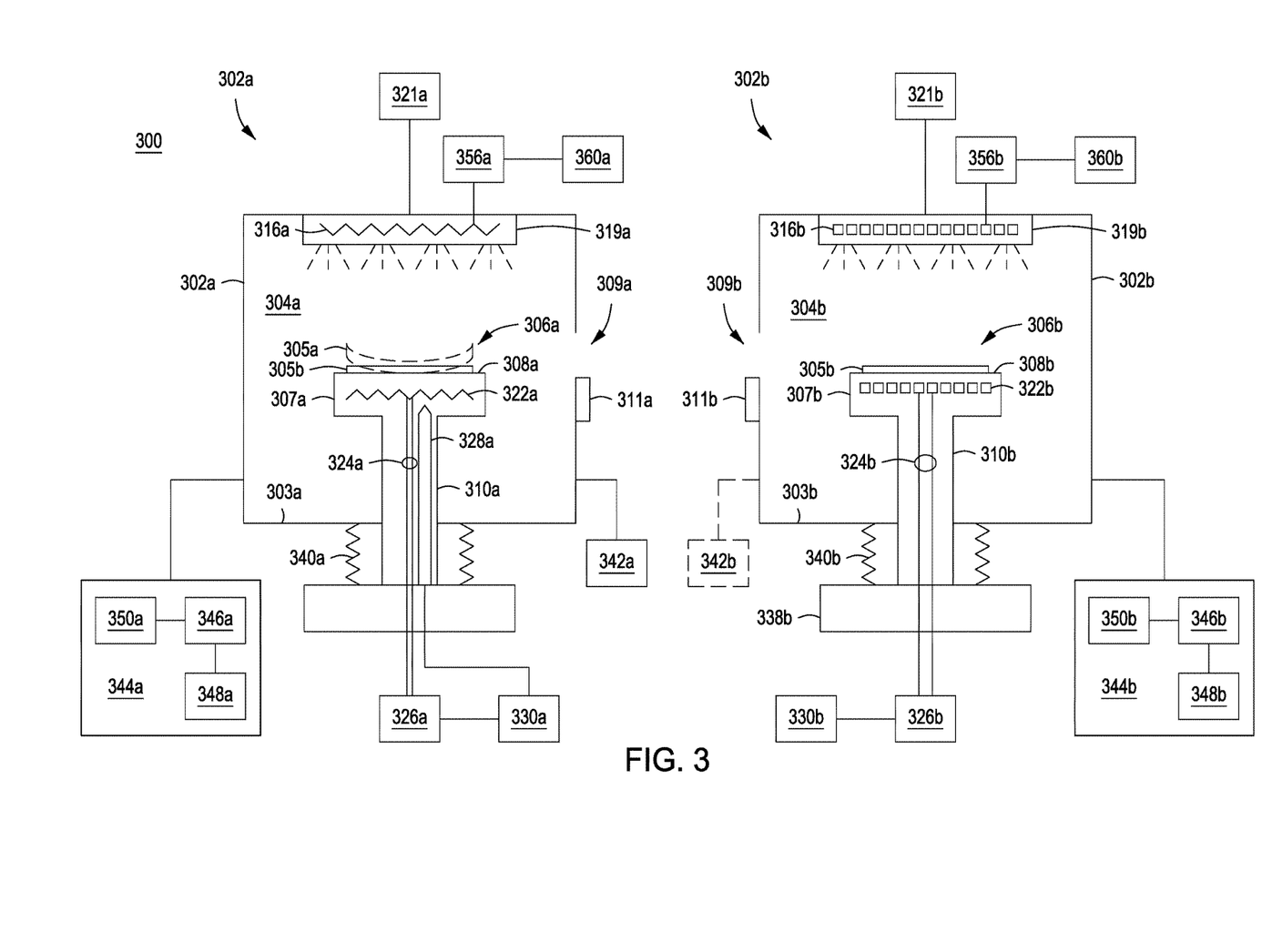
FIG. 3 depicts a block diagram of a substrate processing system in accordance with some embodiments of the present disclosure.

FIG. 3 depicts a block diagram of a substrate processing system 300 suitable for performing the inventive method in accordance with some embodiments of the present disclosure in accordance with embodiments of the present disclosure. For example, a substrate processing system 300 includes a first process chamber 302a (i.e., a heating chamber) having a first processing volume 304a and a first substrate support 306a disposed in the first processing volume 304a for supporting a substrate 305a,b. The first process chamber 302a is an atmospheric chamber (i.e., is not a vacuum chamber). Providing the first process chamber 302a as an atmospheric chamber advantageously reduces the cost of the system since non-vacuum chambers are less expensive to fabricate and maintain than vacuum chambers.

The first substrate support 306a may include a first body 307a having a first support surface 308a and a first shaft 310a to support the first body 307a. Although illustrated in FIG. 1 as a pedestal-type design, the substrate support may be any suitable substrate support having a support surface and a member, such as the first shaft 310a or any other suitable member for supporting the support surface. In some embodiments, the first substrate support 306a may comprise a ceramic material, such as, for example, aluminum oxide ($Al_2O_3$) or aluminum nitride (AlN), or a metallic material, such as, for example, aluminum (Al). The first substrate support 306a does not include a chucking mechanism such as, for example, a vacuum chuck, an electrostatic chuck, clamps, or the like. The first substrate support 306a may also include a lift pin mechanism (similar to driving mechanism 108 of lift pin assembly 107 shown in FIG. 1) having a plurality of lift pins to facilitate placement and removal of the substrate on/from the first support surface 308a.

The first process chamber further includes a first showerhead 319a that is coupled to a first gas panel 321a as illustrated in FIG. 3 to provide one or more process gases to the first processing volume 304a. The one or more process gases may include one or more non-toxic inert gases such as, for example, nitrogen or argon. The first showerhead 319a is merely one exemplary chamber component for delivering one or more process gases to the first processing volume 304a. Alternatively or in combination, the one or more process gases may be delivered to the first processing volume 304a via side injection ports (not shown) disposed about the walls of the first process chamber 302a, or gas inlets disposed in other regions of the process chamber. In some embodiments, the first showerhead 319a may include a second heater 316a disposed in the first showerhead 319a proximate a substrate-facing surface of the showerhead to heat the one or more process gases flowing through the showerhead. The second heater 316a may be any suitable heater used in a showerhead, such as a resistive heater or the like. The second heater 316a is coupled to a second power supply 356a disposed external of the first process chamber 302a. The second power supply 356a may include an alternating current (AC) power source, a direct current (DC) power source or the like. The second power supply 356a may be coupled to a second temperature controller 360a to control the second power supply 356a based on the temperature measured by a thermocouple 328a, which is operatively coupled to the second power supply 356a. In some embodiments, the one or more process gases may alternatively be heated prior to entering the first showerhead 319a.

The first substrate support 306a includes a first heater 322a disposed in the first substrate support 306a proximate the first support surface 308a to provide heat to the substrate 305a,b when disposed on the first support surface 308a. The first heater 322a may be any suitable heater used in a substrate support, such as a resistive heater or the like. The first heater 322a may include one or more conductive lines 324a that extend from the first heater 322a through the first shaft 310a to provide power to the first heater 322a. For example, as illustrated in FIG. 3, the one or more conductive lines 324a may couple the first heater 322a to a first power supply 326a disposed external of the first process chamber 302a. For example, the one or more conductive lines 324a may include a first line for providing power from the first power supply 326a to the first heater 322a and a second line for returning power to the first power supply 326a. The first power supply 326a may include an alternating current (AC) power source, a direct current (DC) power source or the like. Alternatively (not shown), the one or more conductive lines 324a may be a single conductive line, which provides power from the first power supply 326a to the first heater 322a.

The first substrate support 306a may include a thermocouple 328a disposed in the first substrate support 306a to measure a desired temperature, such as the temperature of the first substrate support 306a, the first support surface 308a, or the temperature of the substrate 305a,b when disposed on the first support surface 308a. For example, the thermocouple 328a may be any suitable thermocouple design, such as a thermocouple probe or the like. The thermocouple 328a may be removable. As illustrated in FIG. 3, the thermocouple 328a may extend along the first shaft 310a of the first substrate support 306a to proximate the first support surface 308a. The thermocouple 328a as illustrated in FIG. 3 is merely exemplary, and the tip of the thermocouple may extend to proximate the first heater 322a (as illustrated in FIG. 3) or to above the first heater 322a and proximate the first support surface 308a (not shown). The location of the tip of the thermocouple 328a may be adjusted relative to the first support surface 308a to provide the most accurate measurement of temperature of the substrate 305a,b or of some other component such as the first support surface 308a. The thermocouple 328a may be operatively coupled to a first temperature controller 330a. For example, the first temperature controller 330a may control the first power supply 326a based on the temperature measured by the thermocouple 328a. Alternatively, the first temperature controller 330a may be part of, or coupled to, a system controller, such as the first controller 344a that may control the operations of the first process chamber 302a.

A deformed substrate 305a (shown in phantom) may enter the first process chamber 302a via a first opening 309a in a wall of the first process chamber 302a. The first opening 309a may be selectively sealed via a first slit valve 311a, or other mechanism for selectively providing access to the interior of the chamber through the opening. The first substrate support 306a may be coupled to a first lift mechanism 338a (such as a motor or actuator) that may control the position of the first substrate support 306a between a lower position (as shown) suitable for transferring substrates into and out of the chamber via the first opening 309a and a selectable upper position suitable for processing. The process position may be selected to maximize temperature uniformity across the substrate. The first lift mechanism 338a may be coupled to the first process chamber 302a via a first bellows 340a or other flexible vacuum hose to maintain a predetermined pressure range in the first processing volume 304a when the first substrate support 306a is moved.

The first process chamber 302a may further include a first exhaust system 342a for removing excess process gases from the first processing volume 304a of the first process chamber 302a. For example, the first exhaust system 342a may include a vacuum pump coupled to a pumping plenum via a pumping port for pumping out the exhaust gases from the first process chamber 302a, or any suitable exhaust system. For example, the vacuum pump may be fluidly coupled to an exhaust outlet for routing the exhaust to appropriate exhaust handling equipment. A valve (such as a gate valve, z-motion valve, or the like) may be disposed in the pumping plenum to facilitate control of the flow rate of the exhaust gases in combination with the operation of the vacuum pump.

To facilitate control of the first process chamber 302a as described above, a first controller 344a comprises a first central processing unit (CPU) 346a, a first memory 348a, and first support circuits 350a for the first CPU 346a and facilitates control of the components of the first process chamber 302a. The first controller 344a may any form of general-purpose computer processor that can be used in an industrial setting for controlling various chambers and sub-processors. The first memory 348a, or computer-readable medium, of the first CPU 346a may be one or more of readily available memory such as random access memory (RAM), read only memory (ROM), floppy disk, hard disk, or any other form of digital storage, local or remote. The first support circuits 350a are coupled to the first CPU 346a for supporting the processor in a conventional manner. These circuits include cache, power supplies, clock circuits, input/output circuitry and subsystems, and the like. The methods performed in the first process chamber 302a, or at least portions thereof, may be stored in the first memory 348a as a software routine. The software routine may also be stored and/or executed by another CPU (not shown) that is remotely located from the hardware being controlled by the first CPU 346a.

The substrate processing system 300 further includes a second process chamber 302b (i.e., a cooling chamber) having a second processing volume 304b and a second substrate support 306b disposed in the second processing volume 304b for supporting a planarized substrate 305b. The second process chamber 302b is also an atmospheric chamber (i.e., is not a vacuum chamber). A description of components of the second process chamber 302b that are substantially identical to corresponding components of the first process chamber 302a will be omitted for brevity. Only components of the second process chamber 302b will be described.

In some embodiments, the second process chamber 302b may optionally include a second showerhead 319b that is coupled to a second gas panel 321b as to provide one or more process gases to the second processing volume 304b. The one or more process gases may include one or more non-toxic inert gases such as, for example, nitrogen or argon. Alternatively or in combination, the one or more process gases may be delivered to the second processing volume 304b via side injection ports (not shown) disposed about the walls of the second process chamber 302b, or gas inlets disposed in other regions of the process chamber. The second showerhead 319b may include a first plurality of coolant channels 316b to flow a coolant from a first coolant supply 356b to cool the one or more process gases passing through the second showerhead 319b. The first coolant supply 356b may be coupled to a third temperature controller 360b to control the first coolant supply 356b.

The second substrate support 306b includes a second plurality of coolant channels 322b disposed in the second substrate support 306b proximate the second support surface 308b to provide cool the planarized substrate 305b when disposed on the second support surface 308b. The second plurality of coolant channels 322b supply and return lines 324b that extend from the second plurality of coolant channels 322b through the second shaft 310b to provide coolant to the second plurality of coolant channels 322b. The supply and return lines 324b couple the second plurality of coolant channels 322b to a second coolant supply 326b disposed external of the second process chamber 302b. A fourth temperature controller 330b may control the second coolant supply 326b to selectively supply coolant to the second plurality of coolant channels 322b. Alternatively, the fourth temperature controller 330b may be part of, or coupled to, a system controller, such as the controller 344b that may control the operations of the second process chamber 302b. In some embodiments, the second substrate support 306b may include a chucking mechanism (not shown) such as, for example, a vacuum or electrostatic chuck.

A planarized substrate 305b may enter the second process chamber 302b via a second opening 309b in a wall of the second process chamber 302b. The second opening 309b may be selectively sealed via a second slit valve 311b, or other mechanism for selectively providing access to the interior of the chamber through the opening. The second substrate support 306b may also include a lift pin mechanism (not shown) having a plurality of lift pins to facilitate placement and removal of the substrate on/from the second support surface 308b.

To prepare the first process chamber 302a to planarize a warped substrate 305a, a process gas (e.g., one or more inert gases, such as nitrogen or argon) is flowed into the first processing volume 304a through the first showerhead 319a. Subsequently, the first heater 322a is activated to heat the first substrate support 306a to a first predetermined temperature and the second heater 316a is activated to heat the process gas to a second predetermined temperature. The predetermined temperature may be at or above a glass transition temperature of an epoxy disposed on the substrate (for substrates having an epoxy coating). For example, in some embodiments, the first predetermined temperature and the second predetermined temperature are both between about 150° C. to about 220° C. In some embodiments, the first and second predetermined temperatures are both between about 160° C. to about 220° C. Alternatively, the predetermined temperature may be at or slightly above the glass transition temperature of an epoxy disposed on the substrate (for substrates having an epoxy coating). For example, in some embodiments, the first and second predetermined temperatures are both between about 150° C. to about 160° C. In some embodiments, the first and second predetermined temperatures are both about 160° C.

After the first process chamber 302a is at a predetermined operating temperature, a warped substrate 305a (such as a warped substrate having an epoxy coating) is placed on the first support surface 308a of the first substrate support 306a. In some embodiments, the warped substrate 305a is initially at room temperature (e.g., about 21° C.). The warped substrate 305a is rapidly heated to the first predetermined temperature during a first time period. In the embodiment in which the first predetermined temperature is about 150° C. to about 160° C., or about 160° C., the first time period is between about 5 second and about 10 seconds. The warped substrate 305a is then maintained at the first predetermined temperature for a second time period to deform and planarize the warped substrate 305a into the planarized substrate 305b. In the embodiment in which the first predetermined temperature is about 150° C. to about 160° C., or about 160° C., the second time period is between about 10 seconds and about 2 minutes. Subsequently, the second temperature controller 360a changes the power supplied to the second heater 316a by the second power supply 356a to decrease the temperature of the process gas to a third predetermined temperature. In some embodiments, the third predetermined temperature may be between about 25° C. and about 130° C. As a result, the temperature of planarized substrate 305b is gradually decreased at a first cooling rate to a fourth predetermined temperature during a third time period. In some embodiments, the fourth predetermined temperature is below the glass transition temperature for an epoxy coating disposed on the substrate. In some embodiments, the fourth predetermined temperature is about 130° C. and the third time period is between about 30 seconds to about 2 minutes.

After the planarized substrate 305b has reached the fourth predetermined temperature, the planarized substrate 305b is removed from the first process chamber 302a and placed on the second support surface 308b of the second substrate support 306b to rapidly (i.e., between about 5 seconds to about 10 seconds) cool the planarized substrate at a second cooling rate greater than the first cooling rate. The second processing volume 304b is kept at a fifth predetermined temperature so that the planarized substrate 305b is rapidly cooled when placed in the second process chamber 302b. In some embodiments, the fifth predetermined temperature is between about 5° C. and about 21° C. In some embodiments, a first coolant may be flowed through the second plurality of coolant channels 322b to more quickly cool the planarized substrate 305b. In some embodiments, cooled process gas may optionally also be provided to the second processing volume 304b through the second showerhead 319b, which is cooled by a second coolant flowing through the first plurality of coolant channels 316b. After a fourth time period, the planarized substrate 305b reaches the fifth predetermined temperature. In the embodiment in which the fifth predetermined temperature is about 21° C., the fourth time period is between about 5 second and 10 seconds. Subsequently, the planarized substrate 305b is held at the fifth predetermined temperature for a fifth time period to ensure that the substrate will not deform back to a warped shape. In some embodiments, the fifth time period is about 1 minute.

Figure 4:
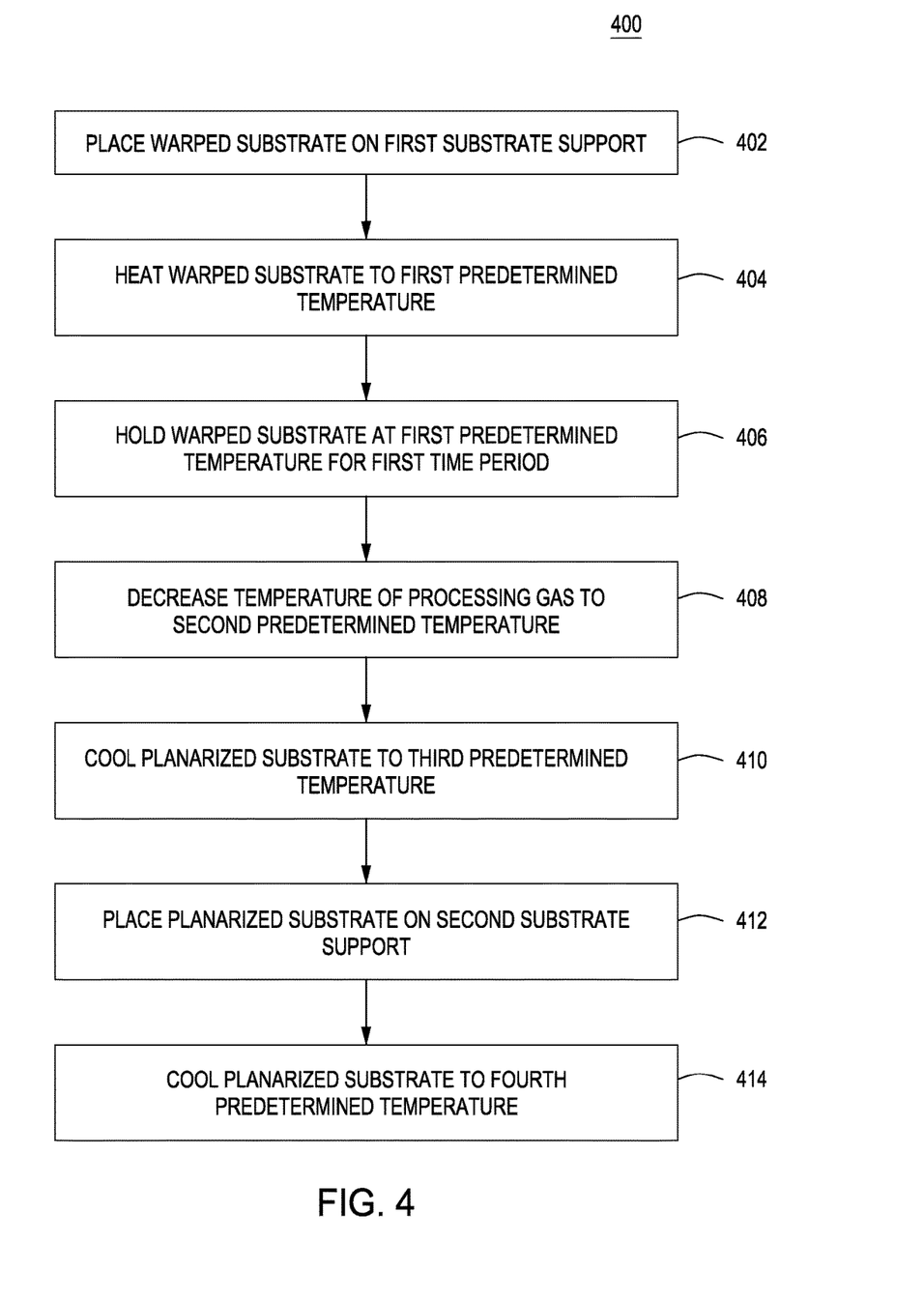
FIG. 4 shows a flow chart illustrating a method for correcting substrate deformity in accordance with some embodiments of the present disclosure.

FIG. 4 is a flowchart illustrating a method 400 for correcting substrate deformity (i.e., flattening a substrate) in accordance with some embodiments of the present disclosure. At 402, a warped substrate 305a is placed on the first substrate support. At 404, the warped substrate 305a is rapidly (i.e., within about 5 second to about 10 seconds) heated to a first predetermined temperature. In some embodiments, the first predetermined temperature is between about 150° C. and about 220° C. In some embodiments, the first predetermined temperature is between about 160° C. and about 220° C. In some embodiments, the first predetermined temperature is between about 150° C. and about 160° C. In some embodiments, the first predetermined temperature is about 160° C. At 406, the warped substrate 305a is held at the first predetermined temperature for a first time period, during which the substrate deforms and becomes planarized. In the embodiment in which the first predetermined temperature is about 150° C. to about 160° C., or about 160° C., the first time period is about 10 seconds to about 2 minutes, or about 2 minutes.

At 408, a temperature of the processing gas entering the first process chamber 302a is decreased to a second predetermined temperature. In some embodiments, the second predetermined temperature is between about 25° C. and about 130° C. At 410, the planarized substrate 305b is cooled to a third predetermined temperature less than the first predetermined temperature at a first cooling rate due to the decrease in the temperature of the process gas. In some embodiments, the third predetermined temperature is about 130° C. At 412, the planarized substrate 305b is placed on a second substrate support 306b of a second process chamber 302b. At 414, the planarized substrate 305b is cooled to a fourth predetermined temperature less than the third predetermined temperature at a second cooling rate greater than the first cooling rate. In some embodiments, the fourth predetermined temperature is about 21° C.

While the foregoing is directed to embodiments of the present disclosure, other and further embodiments of the disclosure may be devised without departing from the basic scope thereof.

The invention claimed is:

1. A substrate flattening system, comprising:
a first process chamber having a first substrate support and a first showerhead, wherein the first substrate support does not include a chucking mechanism;
a first heater disposed in the first substrate support to heat a substrate placed on a first support surface of the first substrate support;
a second heater configured to heat a process gas flowing through the first showerhead into a first processing volume of the first process chamber; and
a second process chamber having a second substrate support, wherein the second substrate support is not heated, and wherein the first process chamber and the second process chamber are both non-vacuum chambers.

2. The substrate flattening system of claim 1, wherein the first process chamber further comprises:
a first power supply electrically coupled to the first heater;
a first temperature controller coupled to the first power supply to control the first power supply;
a second power supply electrically coupled to the second heater; and
a second temperature controller coupled to the second power supply to control the second power supply.

3. The substrate flattening system of claim 2, wherein the first process chamber further comprises:
a thermocouple disposed through a first shaft of the first substrate support and proximate a first support surface of the first substrate support to measure a temperature of the first support surface, wherein the thermocouple is operatively coupled to the first and second temperature controllers.

4. The substrate flattening system of claim 1, wherein the first process chamber further comprises:
a first gas panel fluidly coupled to the first showerhead to supply the first showerhead with the process gas.

5. The substrate flattening system of claim 1, wherein the second heater is disposed in the first showerhead.

6. The substrate flattening system of claim 1, wherein the second substrate support includes a first plurality of coolant channels configured to flow a coolant.

7. The substrate flattening system of claim 6, wherein the second process chamber further comprises:
a second showerhead, wherein the second showerhead includes a second plurality of coolant channels configured to flow a coolant.

8. A method for correcting substrate deformity, comprising:
heating a warped substrate to a first predetermined temperature between about 150° C. and about 220° C.;
holding the substrate at the first predetermined temperature for a first time period; and
cooling the substrate to a second predetermined temperature less than the first predetermined temperature by flowing a coolant through a plurality of heat transfer channels in a substrate support to flatten the substrate.

9. The method of claim 8, wherein the first predetermined temperature is between about 150° C. to about 160° C., the first time period is between about 30 seconds to about 120 seconds.

10. The method of claim 8, wherein the substrate is heated to the first predetermined temperature in a first process chamber and cooled to the second predetermined temperature in a second process chamber.

11. The method of claim 10, further comprising:
cooling the substrate to a third predetermined temperature less than the first predetermined temperature and greater than the second predetermined temperature, wherein the substrate is cooled to the third predetermined temperature in the first process chamber before being cooled to the second predetermined temperature in the second process chamber.

12. The method of claim 11, wherein the first predetermined temperature is about 160° C., wherein the first time period is about 2 minutes, wherein the second predetermined temperature is about 21° C., and wherein the third predetermined temperature is about 130° C.

13. A method for correcting substrate deformity, comprising:
placing a warped substrate on a first substrate support in a first process chamber;
heating the warped substrate to a first predetermined temperature;
holding the warped substrate at the first predetermined temperature for a first time period to deform the warped substrate into a planarized substrate;
cooling the planarized substrate to a second predetermined temperature less than the first predetermined temperature;
placing the planarized substrate on a second substrate support of a second process chamber; and
cooling the planarized substrate to a third predetermined temperature less than the second predetermined temperature.

14. The method of claim 13, wherein heating the warped substrate to the first predetermined temperature comprises:
heating a first support surface of the first substrate support using a heater disposed in the first substrate support; and
flowing a process gas through a first showerhead in the first process chamber at a fourth predetermined temperature, wherein the process gas is an inert gas.

15. The method of claim 14, wherein the process gas is at least one of nitrogen or argon.

16. The method of claim 14, wherein cooling the planarized substrate to the second predetermined temperature comprises:
decreasing a temperature of the process gas to a fifth predetermined temperature less than the fourth predetermined temperature.

17. The method of claim 16, wherein:
the first predetermined temperature is about 150° C. to about 160° C.,
the first time period is about 10 seconds to about 2 minutes,
the second predetermined temperature is about 130° C. or less,
the third predetermined temperature is about room temperature,
the fourth predetermined temperature is between about 160° C. and about 210° C., and
the fifth predetermined temperature is between about 25° C. and 130° C.

18. The method of claim 13, wherein cooling the planarized substrate to the third predetermined temperature comprises flowing a first coolant through a first plurality of coolant channels disposed in the second substrate support.

19. The method of claim 18, wherein cooling the planarized substrate to the third predetermined temperature further comprises:
- flowing a process gas through a second showerhead disposed in the second process chamber, wherein the process gas is an inert gas; and
- flowing a second coolant through a second plurality of coolant channels disposed in the second showerhead to cool the process gas.

20. The method of claim 19, wherein the first and second coolants have a temperature between about 5° C. and about 21° C.

\* \* \* \* \*